United States Patent [19]

Beneking

[11] 3,891,993

[45] June 24, 1975

[54] SEMICONDUCTOR ARRANGEMENT FOR THE DETECTION OF LIGHT BEAMS OR OTHER SUITABLE ELECTRO-MAGNETIC RADIATION

[75] Inventor: Heinz Beneking, Aachen, Germany

[73] Assignee: Licentia-Patent-Verwaltungs-G.m.b.H., Frankfurt am Main, Germany

[22] Filed: Sept. 20, 1973

[21] Appl. No.: 399,042

[30] Foreign Application Priority Data

Sept. 29, 1972 Germany .......... 2247966

[52] U.S. Cl. .......... 357/19; 357/17; 357/18; 357/16; 357/30; 250/370; 250/213 R

[51] Int. Cl. .......... H01l 15/00

[58] Field of Search .......... 317/235 N, 235 AC; 250/370, 213 R; 357/30, 17, 18, 19, 16

[56] References Cited

UNITED STATES PATENTS

| | | | |
|---|---|---|---|
| 3,466,441 | 9/1969 | Batdorf | 250/83.3 |
| 3,752,713 | 8/1973 | Sakuta | 148/171 |

*Primary Examiner*—Martin H. Edlow
*Attorney, Agent, or Firm*—Spencer & Kaye

[57] ABSTRACT

A semiconductor arrangement for the detection of light beams or other suitable electromagnetic radiation comprises at least two regions of semiconductor material having different energy band gaps, one of which produces charge carriers in response to incident electromagnetic radiation and the other of which recombines the charge carriers to produce a light output.

18 Claims, 4 Drawing Figures

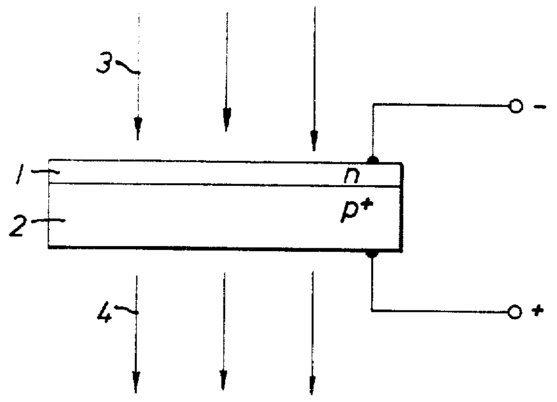
FIG. 1
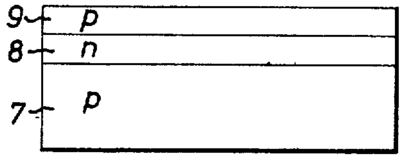
FIG. 2
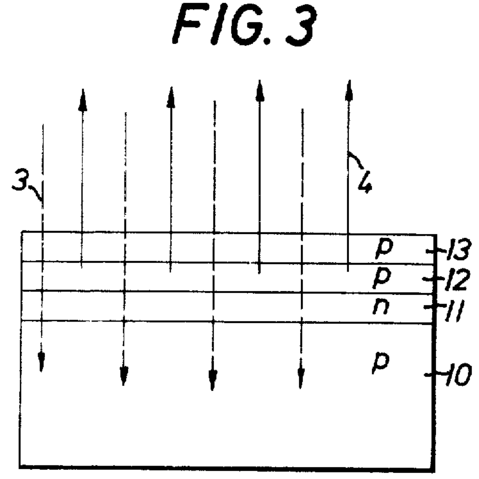
FIG. 3
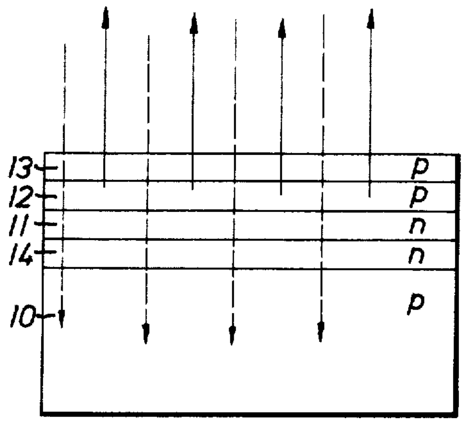
FIG. 4
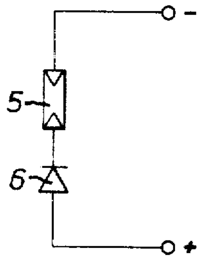

SEMICONDUCTOR ARRANGEMENT FOR THE DETECTION OF LIGHT BEAMS OR OTHER SUITABLE ELECTRO-MAGNETIC RADIATION

BACKGROUND OF THE INVENTION

This invention relates to a semiconductor arrangement for the detection of light beams or other suitable electro magnetic radiation.

Hitherto incoming photons in the invisible spectral region were detected by means of vacuum apparatus. This is effected for example using large area photocathodes and by means of the electro-optical image forming on a luminous screen. Furthermore, opto-electronic semiconductor arrangements are known which convert current into light. The light produced in this case can produce in a directly coupled semiconductor component or in a component separated by a transmission path from the luminiscing semi-conductor component, a measurable current. This receiver element is then for example a photodiode or a phototransistor.

SUMMARY OF THE INVENTION

It is an object of present invention to provide a semiconductor arrangement which is suitable for the detection of light beams.

According to a first aspect of the invention, there is provided a semiconductor arrangement for the detection of light beams, characterized in that the arrangement comprises at least two regions of semiconductor material of different band spacing abutting each other and in that these said regions are so selected that the charge carriers produced in the region of smaller band spacing by light irradiation recombine in the region of the larger band spacing with the emission of light radiation.

According to a second aspect of the invention, there is provided a semiconductor arrangement for the detection of light beams or other suitable electromagnetic radiation comprising a semiconductor body having a first region for producing charge carriers as a result of the incident radiation beam and a second region of larger band spacing than the first region, for recombining the charge carriers produced in the first region to produce an output.

BRIEF DESCRIPTION OF THE DRAWINGS

The invention will now be described in greater detail, by way of example, with reference to the drawings, in which:

FIG. 1 is a schematic representation of the combination of a photo resistance with a luminescence diode in accordance with the invention;

FIG. 2 is a schematic representation of a three region semiconductor arrangement in accordance with the invention;

FIG. 3 is a representation similar to FIG. 2 of a modified semiconductor arrangement and FIG. 4 is a representation similar to FIG. 3 but further modified.

DESCRIPTION OF THE PREFERRED EMBODIMENTS

Basically an arrangement in accordance with the invention, comprises at least two regions abutting each other of semiconductor material of different band spacing, and these regions are so chosen that the charge carriers produced in the region of the smaller band spacing, i.e., band gap, by light irradiation recombine in the region of larger band spacing with the emission of light radiation.

By band spacing or band gap is understood the width of the inhibition band in the band model, thus the spacing of the potential energy of electrodes between the upper limit of the valency band and the lower edge of the conduction band.

The present invention is based on the concept that the semiconductor regions are integrated in one component, which regions behave quite differently with respect to incoming photons. One semiconductor region may have such a small band spacing that there pairs of charge carriers are formed by the input of the radiation energy and thus the number of active charge carriers is substantially increased by the irradiation. In the other region with the large band spacing, the incident radiation produces practically no pairs of charge carriers. On the other hand the charge carriers penetrating into this area recombine very easily because of the large band spacing, and radiation energy becomes liberated.

An arrangement for the type in accordance with the invention is therefore suitable for radiation recording or as an image converter. Radiation impinging on the component in the invisible spectral range can be converted into an image in the visible spectral range. In all, a large number of frequency conversions are possible.

Semiconductor regions of different semiconductor material may be arranged one on top of the other for producing the arrangement in accordance with the invention. In this case so-called hetero-junctions may be formed between the individual regions.

Such region or zone sequences of different semiconductor material may be produced preferably by epitaxial deposition of semiconductor layers. For example semiconductor compounds such as gallium arsenide and gallium aluminium arsenide are suitable as the different materials.

The number of the semiconductor zones or semiconductor regions as well as their spatial extension may, in the case of the arrangement in accordance with the invention, be very different. What is always important is the fact that the doping and the band spacing of the one material used permits traceable formation of charge pairs during the incidence of radiation energy. Means must then be provided whereby the charge carriers produced are transported into the adjacent region of the larger band spacing. Material, doping and band spacing of this second region must then permit a rapid recombination of the charge carriers with the liberation of radiation energy of the desired frequency. The transport of the charge carriers is caused preferably by a field, which in turn arises through a voltage applied to the component.

The reactive effect of the light produced can be suppressed or particularly emphasized by the selected spatial arrangement.

In the simplest case the semiconductor arrangement may comprise only two regions. One region may, for example, act like a photo-resistance which forms a luminescence diode with the other region.

Other suitable semiconductor arrangements can have the zone sequence of a transistor. Individual zones of this transistor structure can again be divided into regions having a different band spacing. The appropriate construction of the arrangement will be directed also to its application. If, for example, laser beams are to be detected with the arrangement in accordance with the invention, an arrangement of two zones is sufficient. If, on the other hand, the arrangement is to be used as an image converter, preference will be given to semiconductor arrangements with more than two zones in order to achieve better resolution properties.

Even in the case of image converters, care must be taken that the recombination region emitting the radiation is constructed to have a large area. The incident direction of the light quanta on to the component must moreover be so selected that a differentiated spatially resolved image of the incident radiation results through the charge carrier recombination. The light quanta will therefore preferably enter perpendicularly to the pn-junction surface. The spacing between the pair production and recombination position must depend on the desired resolution.

The invention will now be described in greater detail, by way of example, with reference to the drawings.

FIG. 1 shows the combination of a photoresistance with a luminescence diode, a hetero junction existing between the individual regions of this combined component.

The semiconductor component comprises the regions 1 and 2. The region 1, which forms the photoresistance and thus must comprise a material with small band spacing, is for example of relatively high resistance gallium arsenide of n-type conductivity. The low resistance region 2 of $p^+$ conductivity abuts this gallium arsenide region, which region 2 for example comprises a gallium aluminium arsenide in order to obtain a larger band spacing. In this case the band spacing is also dependent on the percentual distribution of the different components of the compound semiconductor. The material composition $Ga_xAl_{1-x}As$ can be selected for example, wherein the value $x$ is two-thirds in one case for example. The $Ga_xAl_{1-x}As$ layer is doped with zinc, for example, and has an impurity concentration of $10^{19}$ – $10^{20}$ atoms per $cm^3$. A voltage is so applied to the semiconductor arrangement that the luminiscence diode formed by the hetero junction between the regions 1 and 2 is poled in the forward direction. Now if, for example, infra-red radiation 3 impinges on the semiconductor layer 1, the incident radiation energy of the resistance of the region 1 is reduced as a result of the production of the charge carriers. The electrons produced in region 1 pass, because of the voltage applied, to the region 2 and here they recombine with the emission of radiation. In the case of the material composition given, it is a question in the case of the emitted radiation of visible red light. If the semiconductor arrangement is swung out for example into an invisible laser beam, the component lights up and thus shows the presence of the laser beam or its local position.

The equivalent circuit diagram of the semiconductor arrangement of photo-resistance 5 and luminescence diode 6 connected one after the other is shown in the lower part of FIG. 1.

In accordance with the embodiment of FIG. 2, the arrangement comprises e.g. three regions with the region sequence npn or pnp. This transistor structure is then so driven that the diode formed by the hetero-junction is driven in the blocking direction and the operating point lies in the characteristic curve kink of the breakdown region. In this case the blocking current is substantially increased by the incoming light quanta; the charge carriers arrive in the semiconductor region of large band spacing and there recombine with the emission of radiation. The arrangement of FIG. 2 comprises three regions 7, 8 and 9. The region 7 of p-type conductivity comprising gallium arsenide, which, for example, has an impurity concentration of $10^{17}$ atoms per $cm^3$, is used for example as the substrate. A region 8 of n-type conductivity of $Ga_xAl_{1-x}As$ (e.g. $x$ = two-thirds) is applied to this substrate body by epitaxial deposition. Epitaxial deposition from the liquid phase is particularly suitable for this. The region of n-type conductivity is doped for example with tellurium and has an imperfection concentration of $10^{18}$ atoms per $cm^3$. The layer thickness of this region is approximately 1 $\mu m$. Then further, a region 9 of p-type conductivity comprising $Ga_xAl_{1-x}As$ with a layer thickness of approximately 1 $\mu m$ and a doping of $10^{18}$ atoms per $cm^3$, is applied to the zone 8 of n-type conductivity, preferably also by epitaxial deposition from the liquid phase. Zinc is suitable as the doping material. The pn-junction between the regions 7 and 8 is stressed in the blocking direction, the operating point being located in the characteristic curve kink of the breakdown region. The charge carrier multiplication can be used in this way as internal amplification. The charge carriers produced in the semiconductor region of small band spacing and the charge carriers resulting in the sequence through charge carrier multiplication recombine in the semiconductor region of large band spacing with the emission of light. The spectral range of the light in this case is dependent on the material selection; in the case of the example stated again infrared light can be converted into visible red light. An amplification effect can also be achieved in that the light produced reacts and in its turn produces pairs of carriers.

The semiconductor arrangement according to FIG. 3 substantially corresponds to the arrangement in accordance with FIG. 2. The outer region of p-type conductivity of large band spacing is above all subdivided into two part-regions 12 and 13, the outer region 13 comprising a material, the band spacing of which is still greater than that of the region 12 on the inside. Both regions 12 and 13 preferably comprise $Ga_xAl_{1-x}As$, wherein, in the region 12, $x$ has the value $x$ = two-thirds and in the region 13, $x$ has the value $x$ = one-third. By this subdivision of the region of larger band spacing a better spatial resolution of the image to be reproduced is obtained from the radiation picked up.

The application of the electrical operating voltage intermittently dependent on the type of the selected inner amplification can be recommended. The gradation of the image produced is then improved and moving pictures are reproduced better. The regions 10 and 11 of FIG. 3 correspond to the regions 7 and 8 of FIG. 2. Also this arrangement is so driven that the hetero junction is stressed in the blocking direction and the operating point is located in the characteristic curve kink of the breakdown region. Since the substrate body 10 is relatively thick, the arrangement is preferably so arranged in the incoming beam path that the light quanta 3 impinge on the upper surface of the region 13. The light quanta penetrate the regions 11, 12 and 13 without producing charge carriers there, since the large band spacing in these regions does not permit the formation of pairs of charge carriers here. The charge carriers are produced only in the region of the blocking layer between the regions 11 and 10 and in the base body 10. These charge carriers arrive after possible multiplication in the regions of larger band spacing and there recombine with the emission of light 4. Since the pn-junctions are of a large area and extend over the entire cross-section of the semiconductor body, the reproduction of an image incident in another spectral range with good resolution is possible.

In the case of the arrangement according to FIG. 4 the region of n-type conductivity is divided into two regions. The newly added part 14 comprises preferably gallium arsenide of n-type conductivity which, for example is provided with an impurity concentration of $10^{18}$ atoms per $cm^3$. The entire arrangement thus comprises a diode of regions 10 and 14, which are made up of the same material and thus also have the same band spacing. This diode is stressed in the blocking direction.

The increased blocking current produced by light quanta arrives in the zones 11, 12 and 13 and there produce radiation 4 by recombination.

The outer regions of the semiconductor arrangements must in each case be provided with connection contacts, which must be so selected that the light input or the light output is not or only insubstantially hindered. This can be realised for example by grid-shaped contacts or by very thin contacts which are still transparent.

It will be understood that the above description of the present invention is susceptible to various modification changes and adaptations.

What is claimed is:

1. A semiconductor arrangement for the detection of light beams comprising in combination:

a semiconductor body having a first region of a first conductivity type, constituting a light sensitive photo-resistance, for producing charge carriers as a result of light irradiation and a second region of semiconductor material of a larger band spacing than said first region and of the opposite conductivity type abutting said first region and forming a pn hetero-junction luminescent diode therewith, said second region recombining said charge carriers to emit light radiation; and means for applying a voltage across said first and second region to polarize said pn hetero-junction in the forward direction.

2. A semiconductor arrangement as defined in claim 1, wherein said photo-resistance comprises gallium arsenide of n-type conductivity, and said second semiconductor region is of p-type conductivity and comprises gallium aluminium arsenide.

3. A semiconductor arrangement as defined in claim 1 wherein said section region emitting the radiation is constructed with a large area and wherein the incident direction of the light quanta is chosen such that a differentiated, spatially resolved image of the incident radiation results through the charge carrier recombination.

4. A semiconductor arrangement as defined in claim 3, wherein the light quanta enter the pn-junction surface perpendicularly.

5. A semiconductor arrangement as defined in claim 1, wherein the regions of a material with a smaller band spacing comprise gallium arsenide and the regions of the material with large band spacing comprise gallium aluminium arsenide.

6. A semiconductor arrangement as defined in claim 1, wherein said region of the smaller band spacing is sensitive to invisible light and said region of larger band spacing emits visible light.

7. A semiconductor arrangement as defined in claim 1, wherein said region of smaller band spacing is sensitive to laser light.

8. A semiconductor arrangement for the detection of light beams comprising in combination: a semiconductor body having a sequence of three regions of alternating conductivity type, one of the outer of said three regions being formed of a semiconductor material having a band spacing which is smaller than that of the other outer region and at least the portion of the intermediate opposite conductivity type region which abuts said other outer region, and which produces charge carriers as a result of light irradiation; the portions of said other regions formed of semiconductor material of a larger band spacing than said one outer region recombining said charge carriers to cause the emission of light radiation; and means for applying a voltage across said semiconductor body to polarize the pn junction formed between said one outer region and the abutting region of opposite conductivity type in the blocking direction.

9. A semiconductor arrangement as defined in claim 8, wherein said three regions have the sequence pnp.

10. A semiconductor arrangement as defined in claim 8, wherein said three regions have the sequence npn.

11. A semiconductor arrangement as defined in claim 8, wherein said other outer region comprises two partial regions to provide the region sequence pnpp.

12. A semiconductor arrangement as defined in claim 11, wherein the outer partial region of said other outer region of p-type conductivity, comprises a material the energy gap of which is greater than that of the inner partial region of p-type conductivity.

13. A semiconductor as defined in claim 12 wherein said one outer region of p-type conductivity which abuts the region of n-type conductivity comprises a material with a band spacing which is smaller than that of the entire region of n-type conductivity.

14. A semiconductor arrangement as defined in claim 12, wherein the region of n-type conductivity comprises two part-regions, the part-region abutting said one outer region of p-type conductivity comprising a material the band spacing of which is smaller than that of the other part-region of n-type conductivity.

15. A semiconductor arrangement as defined in claim 8, wherein said arrangement comprises the active element of an image converter tube.

16. A semiconductor arrangement as defined in claim 14 wherein said part-region of said n-type conductivity region which abuts said one outer region is formed of a semiconductor material with the same band spacing as said one outer region.

17. A semiconductor arrangement as defined in claim 13 wherein said one outer region is formed of gallium arsenide and said other regions are formed of gallium aluminium arsenide.

18. A semiconductor arrangement as defined in claim 8 wherein the surface of said other outer region is exposed to the light irradiation.

* * * * *